US012812813B2

(12) United States Patent
Takabayashi

(10) Patent No.: US 12,812,813 B2
(45) Date of Patent: Nov. 24, 2026

(54) ELECTRONIC DEVICE

(71) Applicant: Mitsubishi Electric Corporation, Tokyo (JP)

(72) Inventor: Hirokazu Takabayashi, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 261 days.

(21) Appl. No.: 18/718,074

(22) PCT Filed: Feb. 17, 2022

(86) PCT No.: PCT/JP2022/006409
§ 371 (c)(1),
(2) Date: Jun. 10, 2024

(87) PCT Pub. No.: WO2023/157183
PCT Pub. Date: Aug. 24, 2023

(65) Prior Publication Data

US 2025/0048584 A1 Feb. 6, 2025

(51) Int. Cl.
*H05K 7/20* (2006.01)

(52) U.S. Cl.
CPC ..... *H05K 7/20145* (2013.01); *H05K 7/20163* (2013.01); *H05K 7/20418* (2013.01);
(Continued)

(58) Field of Classification Search
CPC ........... H05K 7/20145; H05K 7/20163; H05K 7/20418; H05K 7/20509; H05K 7/20863;
(Continued)

(56) References Cited

U.S. PATENT DOCUMENTS

2012/0012294 A1* 1/2012 Miki ....................... B61C 17/00 165/185
2015/0371920 A1* 12/2015 Kawaguchi ............. B61C 17/00 361/704

(Continued)

FOREIGN PATENT DOCUMENTS

JP H05259325 A 10/1993
JP H06023256 U 3/1994

(Continued)

OTHER PUBLICATIONS

Hashimoto Takashi; Fukuda Kazuaki, "Power Converter for Railway Vehicle", Jan. 18, 2007, Toshiba Corp, Entire Document (Translation of JP2007013223). (Year: 2007).*

(Continued)

*Primary Examiner* — Stephen S Sul
(74) *Attorney, Agent, or Firm* — Buchanan Ingersoll & Rooney PC

(57) ABSTRACT

An electronic device includes a base being heat conductive and having a first main surface to which an electronic component is attachable, and a plurality of fins attached to a second main surface of the base and extending in a first extension direction and in a second extension direction. The plurality of fins dissipate heat transferred from the electronic component through the base to ambient air. The electronic device further includes one or more air guides each including a first member surrounding the plurality of fins and having a main surface intersecting with the first extension direction, and a second member attached to the first member and having a main surface extending away from centers of the plurality of fins in the first extension direction.

15 Claims, 13 Drawing Sheets

(52) U.S. Cl.
CPC ..... *H05K 7/20509* (2013.01); *H05K 7/20863* (2013.01); *H05K 7/20918* (2013.01)

(58) Field of Classification Search
CPC . H05K 7/20918; B61D 27/0072; B61C 17/00
See application file for complete search history.

(56) References Cited

U.S. PATENT DOCUMENTS

| | | | |
|---|---|---|---|
| 2017/0238441 A1 | 8/2017 | Kaneko et al. | |
| 2017/0303430 A1* | 10/2017 | Enami | B61C 3/00 |
| 2017/0341521 A1 | 11/2017 | Kaneko et al. | |
| 2019/0039461 A1* | 2/2019 | Uehara | H05K 7/20918 |
| 2020/0232711 A1 | 7/2020 | Kim | |

FOREIGN PATENT DOCUMENTS

| | | | | |
|---|---|---|---|---|
| JP | H06315265 A | | 11/1994 | |
| JP | 2001-102503 A | | 4/2001 | |
| JP | 2001168561 A | | 6/2001 | |
| JP | 2007013223 A | * | 1/2007 | H05K 7/20936 |
| JP | 2017039481 A | | 2/2017 | |
| JP | 2018100069 A | | 6/2018 | |
| WO | 2010109799 A1 | | 9/2010 | |

OTHER PUBLICATIONS

International Search Report (PCT/ISA/210) with translation and Written Opinion (PCT/ISA/237) mailed on May 10, 2022, by the Japanese Patent Office as the International Searching Authority for International Application No. PCT/JP2022/006409. (9 pages).

Notice of Reasons for Refusal with translation dated Apr. 2, 2024 issued by the Japanese Patent Office in corresponding Japanese Patent Application No. 2024-500818. (8 pages).

Extended European Search Report dated Mar. 11, 2025, issued in the corresponding European patent Application No. 22927085.5, 8 pages.

Office Action dated Jan. 21, 2026, issued in the corresponding German Patent Application No. 112022006667.9, 7 pages including 3 pages of English Translation.

* cited by examiner

ELECTRONIC DEVICE

TECHNICAL FIELD

The present disclosure relates to an electronic device.

BACKGROUND ART

To prevent electronic components as heating elements from being damaged by heat generated during energization, an electronic device may include a cooler that is thermally connected to such an electronic device. For example, an electronic device installable on a railway vehicle, or more specifically, a power converter, cools electronic components by dissipating, with a cooler, heat generated by the electronic components to passing air caused by the traveling vehicle. Patent Literature 1 describes a heat sink attached under the floor of a railway vehicle, as an example cooler included in such an electronic device. The heat sink described in Patent Literature 1 includes a base and multiple fins attached to the base to extend in the traveling direction of the vehicle and in the vertical direction.

CITATION LIST

Patent Literature

Patent Literature 1: International Publication No. 2010/109799

SUMMARY OF INVENTION

Technical Problem

The heat sink described in Patent Literature 1 includes flat plates as airflow regulators at the ends of the heat sink in the traveling direction of the vehicle to regulate passing air, with the main surfaces of the regulators facing the base across multiple fins, and plate-like reinforcements connected to the airflow regulators and the base to cover end portions of the multiple fins. The airflow regulators and the reinforcements cause the ends of the fins in the traveling direction to be covered with flat plates with the main surfaces extending in the traveling direction. This reduces the amount of air flowing through the fins from the ends in the traveling direction, reducing the cooling performance of the heat sink. The same applies to, in addition to the electronic device installable on the vehicle, an electronic device that cools electronic components by transferring heat from the fins to air provided from outside.

Under such circumstances, an objective of the present disclosure is to provide an electronic device that has high cooling performance.

Solution to Problem

To achieve the above objective, an electronic device according to an aspect of the present disclosure includes a base being heat conductive, a plurality of fins, and one or more air guides. The base has a first main surface to which an electronic component is attachable. The plurality of fins are spaced from one another and are attached to a second main surface of the base. The second main surface is opposite to the first main surface. The plurality of fins extend in a first extension direction along the second main surface and in a second extension direction away from the second main surface. The plurality of fins dissipate heat transferred from the electronic component through the base to ambient air. The one or more air guides each include a first member surrounding the plurality of fins and having a main surface intersecting with the first extension direction, and a second member attached to the first member and having a main surface extending away from centers of the plurality of fins in the first extension direction.

Advantageous Effects of Invention

The electronic device according to the above aspect of the present disclosure includes the air guides each including the first member and the second member to increase the pressure difference between the windward and the leeward of the fins and increase the speed of air flowing around the fins, as compared with a structure in which the ends of the fins are covered with flat plates with the main surfaces extending in the extending direction of the fins. The electronic device thus can have high cooling performance.

DESCRIPTION OF EMBODIMENTS

An electronic device according to one or more embodiments of the present disclosure is described in detail below with reference to the drawings. In the figures, the components identical or corresponding to each other are provided with the same reference sign.

As an example electronic device, an in-vehicle device is installable on the roof of a railway vehicle. An electronic device 1 according to an embodiment is described as, for example, an in-vehicle device that cools electronic components using passing air that is an airflow caused by a traveling railway vehicle. The passing air flows in a direction opposite to the traveling direction of the railway vehicle.

Figure 1:
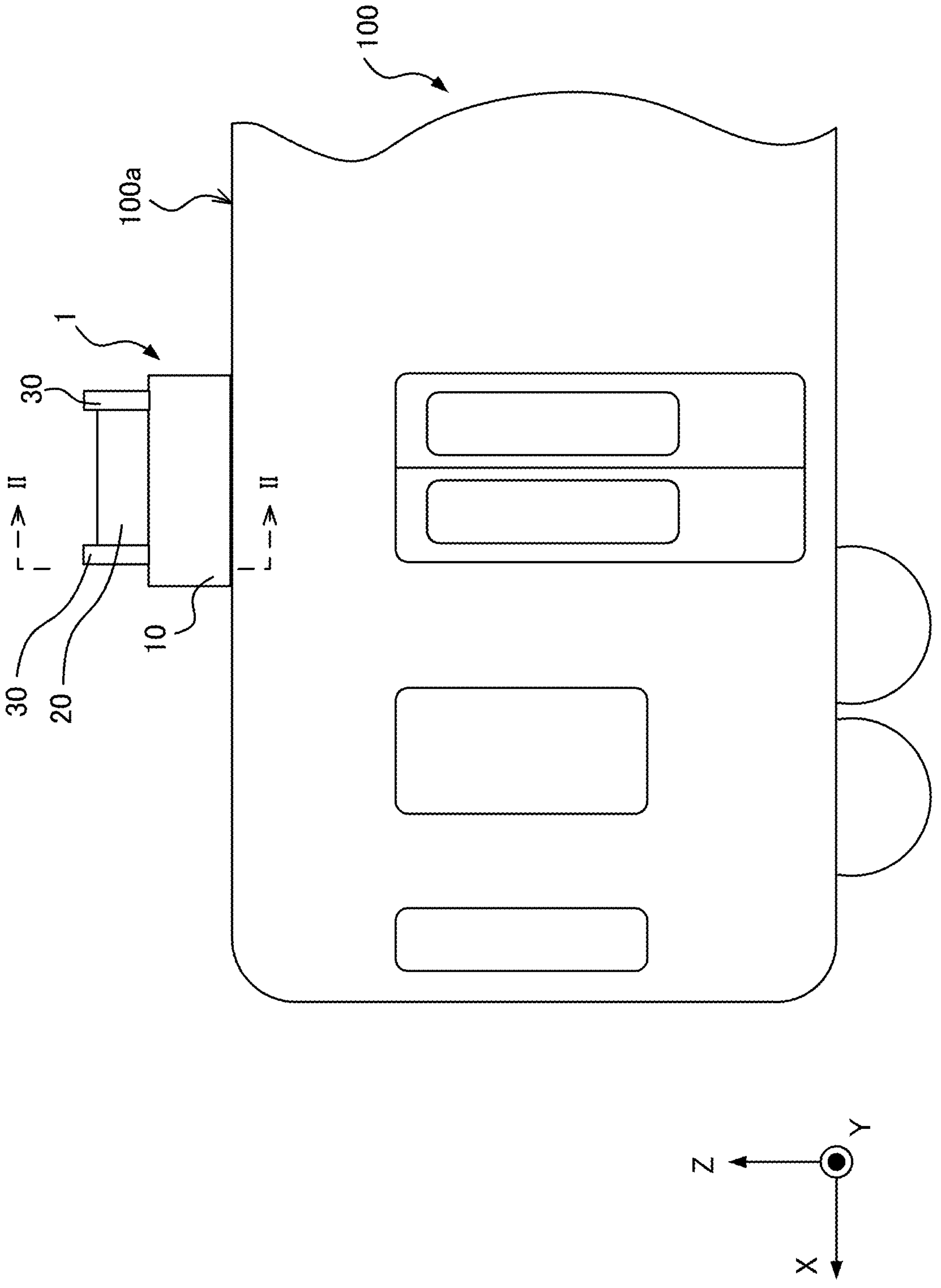
FIG. 1 is a diagram of an electronic device according to an embodiment installed on a vehicle.

The electronic device 1 illustrated in FIG. 1 is installed on a roof 100*a* of a vehicle 100 that is, for example, a railway vehicle. As illustrated in FIG. 1, as well as in FIG. 2 being a cross-sectional view of the electronic device 1 taken along line II-II as viewed in the direction indicated by the arrows in FIG. 1, the electronic device 1 includes a base 21 being heat conductive and having a first main surface 21*a* to which electronic components 11 are attached, multiple fins 20 attached to a second main surface 21*b* of the base 21 to dissipate heat transferred from the electronic components 11 through the base 21 to ambient air, and one or more air guides 30 surrounding the fins 20.

It is preferable that the electronic device 1 further includes a housing 10 located on the roof 100*a* and accommodating the electronic components 11. In this case, the base 21 may be attached to the housing 10 to cover an opening 10*a* in the housing 10.

Figure 2:
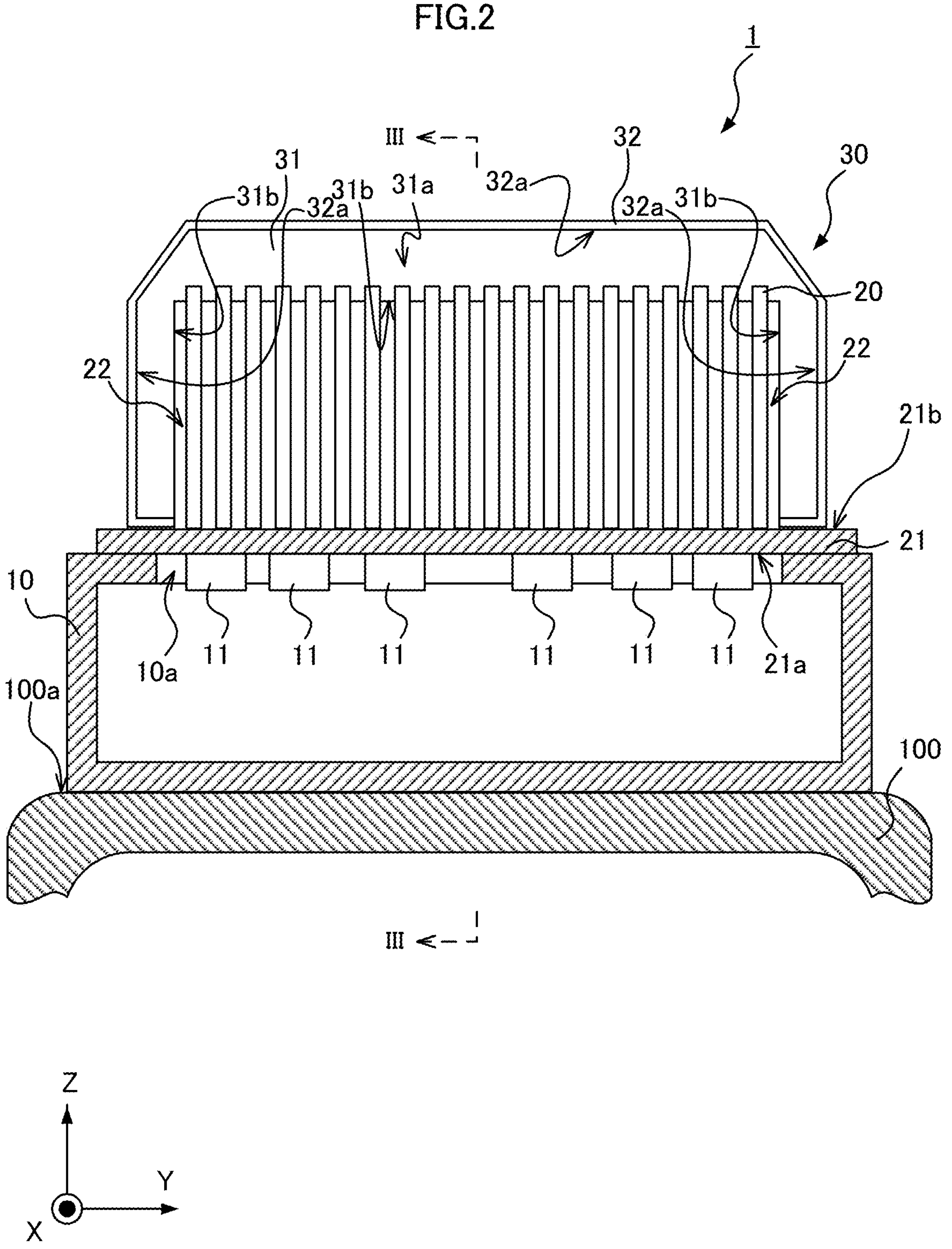
FIG. 2 is a cross-sectional view of the electronic device according to the embodiment taken along line II-II as viewed in the direction indicated by the arrows in FIG. 1.

In FIGS. 1 and 2, Z-axis indicates the vertical direction for the vehicle 100 that is located horizontally, X-axis indicates the traveling direction of the vehicle 100, and Y-axis indicates the width direction of the vehicle 100. X-axis, Y-axis, and Z-axis are perpendicular to one another. The same applies to the subsequent figures.

The housing 10 is attached to a vertically upper portion of the roof 100*a*. The housing 10 has rigidity and strength to resist deformation under the maximum expected vibrations from the railway vehicle. For example, the housing 10 is formed of a metal such as iron or aluminum. The housing 10 has the opening 10*a* in a vertically upper portion.

The base 21 is attached to the housing 10 to cover the opening 10*a*. In the embodiment, the base 21 is a plate of a highly thermally conductive material, or for example, a metal such as iron or aluminum, and is attached to the outer surface of the housing 10 to cover the opening 10*a*. The electronic components 11 that generate heat, or for example, switching elements included in a power converter that converts power supplied from a power supply to power to be supplied to a load, are attached to the first main surface 21*a* of the base 21. The fins 20 are attached to the second main surface 21*b* opposite to the first main surface 21*a*. For example, the ends of the fins 20 are received in grooves on the second main surface 21*b*. For the vehicle 100 located horizontally, the first main surface 21*a* and the second main surface 21*b* extend horizontally.

The base 21 may firmly be attached to the housing 10 to an extent that a positional relationship relative to the housing 10 does not change even under vibrations from the traveling vehicle 100. More specifically, the base 21 is attached to the outer surface of the housing 10 with an attaching method such as fitting, brazing, welding, bonding with an adhesive, or fastening with a fastener.

The multiple fins 20 are spaced from one another and are attached to the second main surface 21*b*. In the embodiment, twenty fins 20 are spaced from one another in Y-direction and attached to the second main surface 21*b*. The fins 20 may firmly be attached to the base 21 to an extent that a positional relationship relative to the base 21 does not change even under vibrations from the traveling vehicle 100. More specifically, the fins 20 are attached to the second main surface 21*b* of the base 21 with an attaching method such as fitting, brazing, welding, bonding with an adhesive, or fastening with a fastener.

Each fin 20 extends both in a first extension direction along the second main surface 21*b* and in a second extension direction away from the second main surface 21*b*. In the embodiment, the first extension direction is parallel to X-axis, and the second extension direction is parallel to Z-axis. In other words, the fins 20 are flat plates attached to the second main surface 21*b* with the main surfaces perpendicular to Y-axis.

Each fin 20 dissipates heat transferred from the electronic components 11 through the base 21 to ambient air. When, for example, the vehicle 100 is traveling, heat is transferred from the fins 20 to passing air flowing along the fins 20. The fins 20 are formed of a highly thermally conductive material, or for example, a metal such as copper or aluminum.

Figure 3:
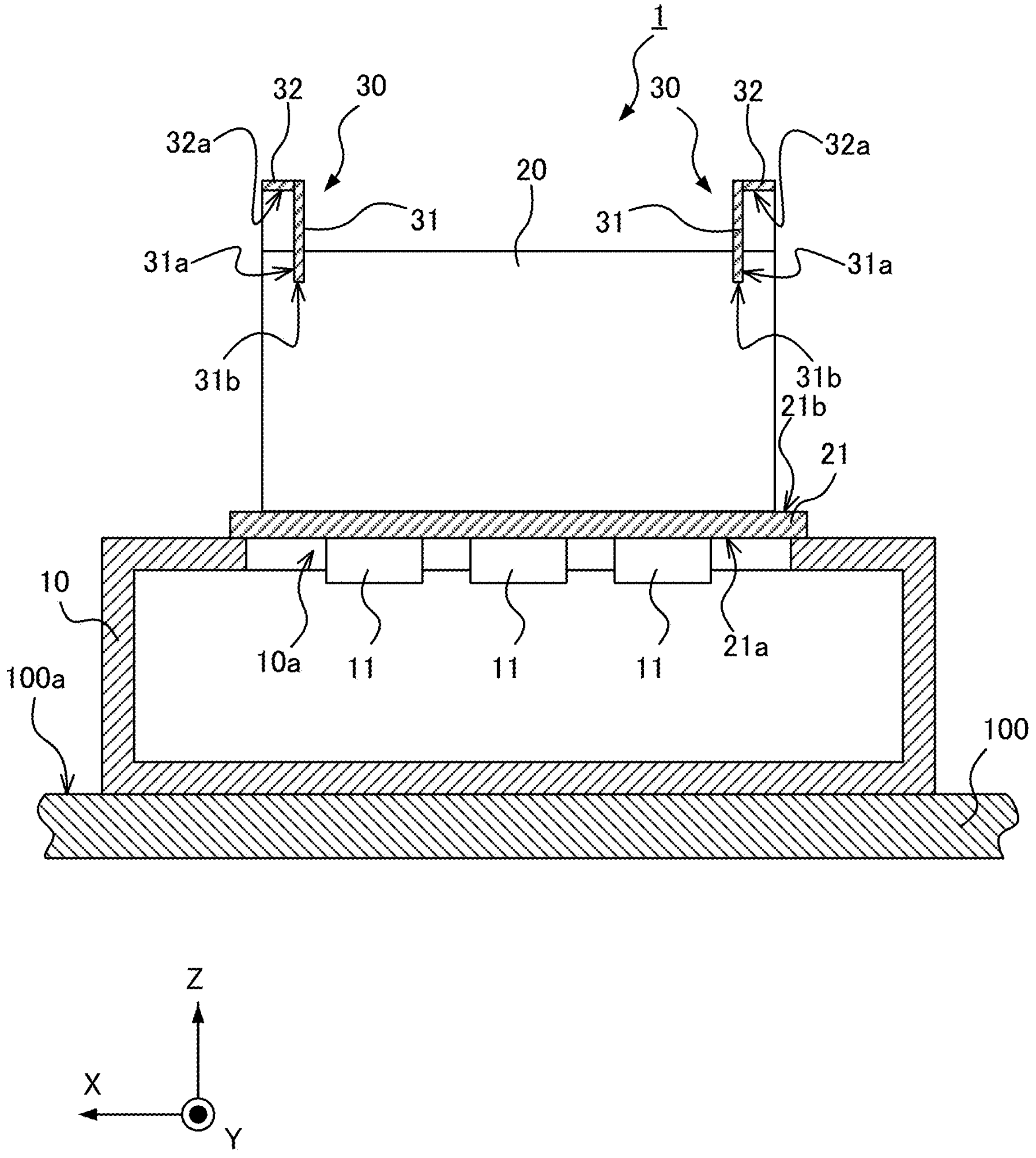
FIG. 3 is a cross-sectional view of the electronic device according to the embodiment taken along line III-III as viewed in the direction indicated by the arrows in FIG. 2.

In the embodiment, as illustrated in FIG. 3, the electronic device 1 includes two air guides 30 at both ends of the fin 20 in X-direction. One of the two air guides 30 surrounds the one ends of the fins 20 in the first extension direction, or for example, surrounds the ends of the fins 20 in the positive X-direction. More specifically, one of the two air guides 30 extends in a direction surrounding the fins 20 extending in the X-axis at a position adjacent to the ends of the fins 20 in the positive X-direction. The other of the two air guides 30 surrounds the other ends of the fins 20 in the first extension direction, or for example, surrounds the ends of the fins 20 in the negative X-direction. More specifically, the other of the two air guides 30 extends in a direction surrounding the fins 20 extending in the X-axis at a position adjacent to the ends of the fins 20 in the negative X-direction. The two air guides 30 have the same structure and are symmetric with respect to a YZ plane that includes the centers of the fins 20 in X-direction. The air guides 30 may be located adjacent to the fins 20 to an extent that passing air is guidable to the fins 20.

Each air guide 30 may firmly be attached to the base 21 to an extent that a positional relationship relative to the base 21 does not change even under vibrations from the traveling vehicle 100. More specifically, each air guide 30 is attached to the second main surface 21*b* of the base 21 with an attaching method such as fitting, brazing, welding, bonding with an adhesive, or fastening with a fastener.

Each air guide 30 includes a first member 31 surrounding the fins 20, and a second member 32 attached to the first member 31 and having a main surface extending away from the centers of the fins 20 in the first extension direction.

Figure 4:
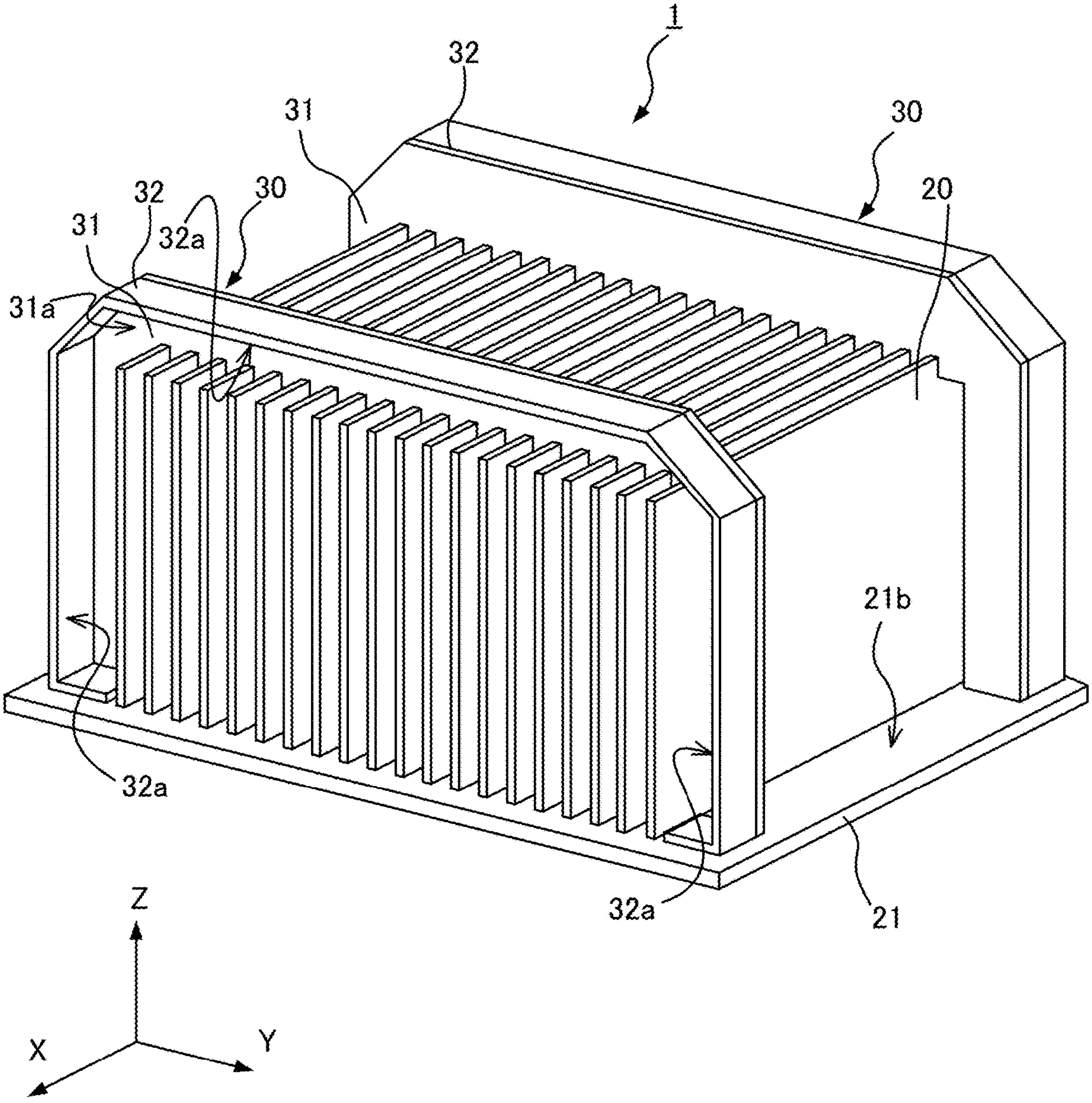
FIG. 4 is a perspective view of the electronic device according to the embodiment.
Figure 5:
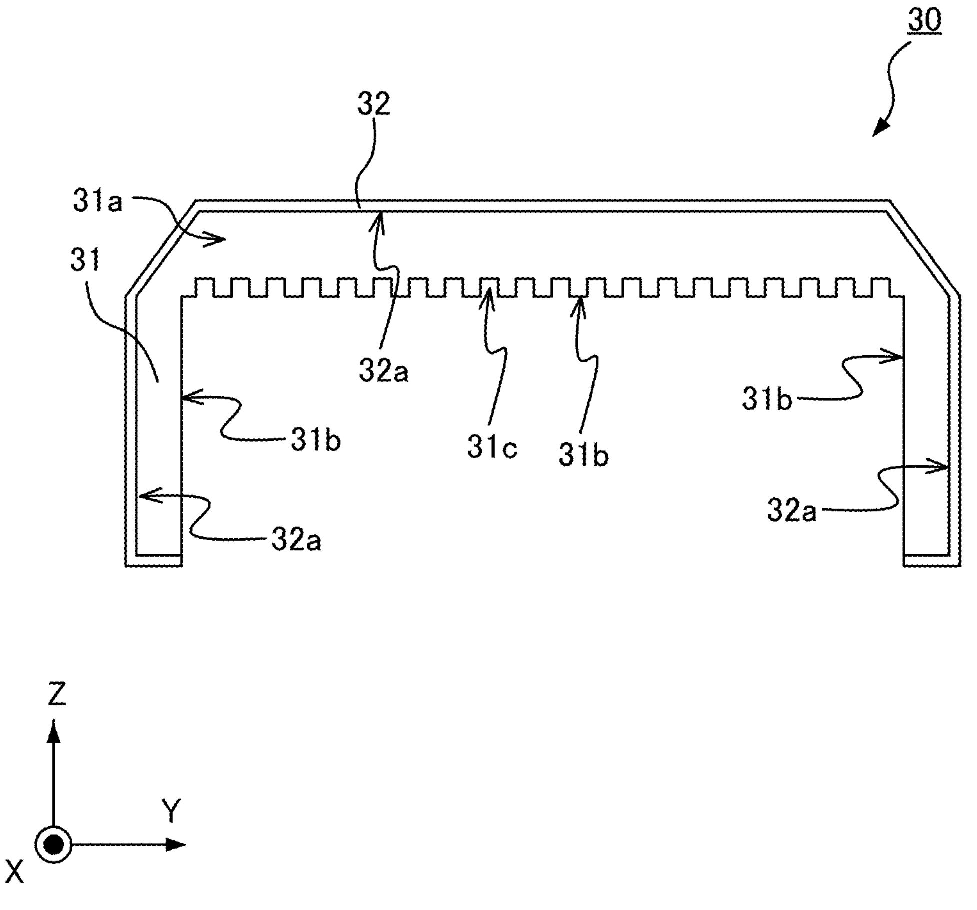
FIG. 5 is a front view of an air guide in the embodiment.
Figure 6:
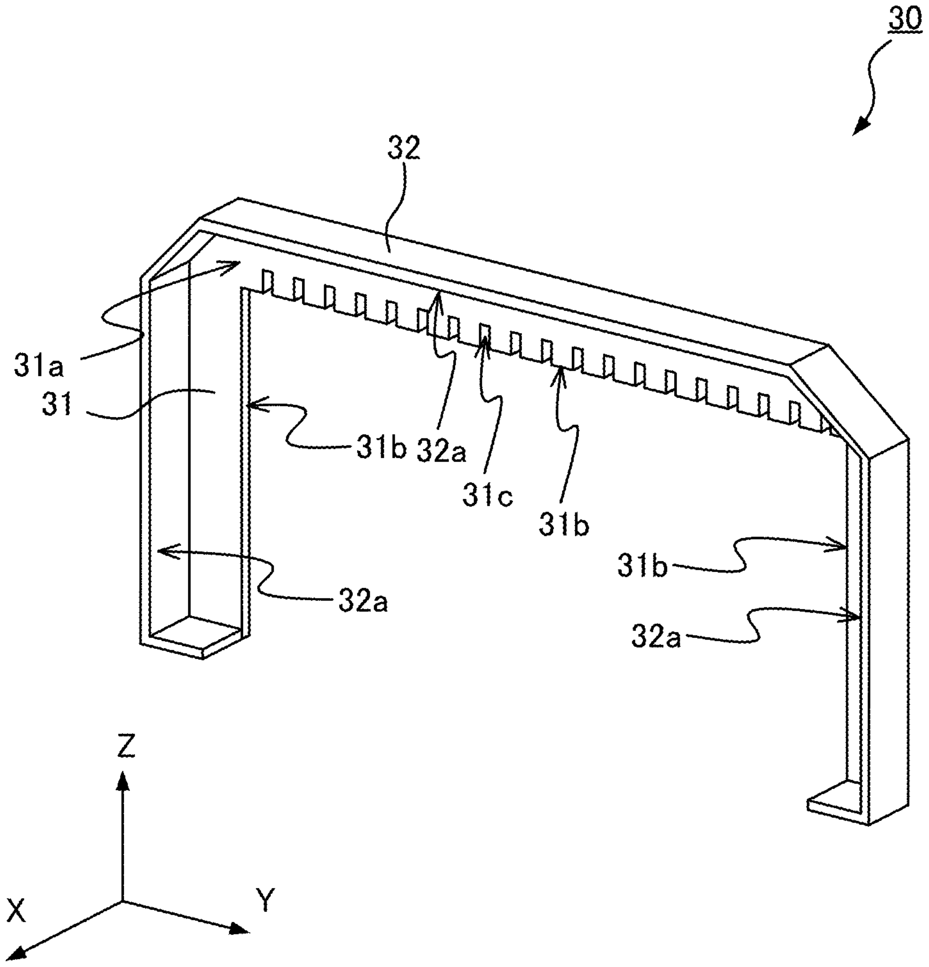
FIG. 6 is a perspective view of the air guide in the embodiment.

As illustrated in FIGS. 4 to 6, the first member 31 is a plate extending in a direction surrounding the fins 20 extending in the X-axis. More specifically, the first member 31 has a main surface 31*a* intersecting with the first extension direction, and side surfaces 31*b* facing the fins 20. The housing 10 is not illustrated in FIG. 4. In the embodiment, the first member 31 is in contact with the end of each fin 20 distant from the base 21, in other words, the end of each fin 20 in the positive Z-direction. To suppress misalignment of the ends of the fins 20 in Y-direction, the first member 31 has multiple slits 31*c* fitted with the ends of the fins 20 in the positive Z-direction.

For example, a portion of the first member 31 located in the positive Z-direction from the fins 20 has a length in Z-direction that is ⅕ to ⅓ inclusive of the length of the fins 20 in Z-direction. Similarly, a portion of the first member 31 adjacent to the fins 20 in Y-direction has a length in Y-direction that is ⅕ to ⅓ inclusive of the length of the fins 20 in Z-direction. With the length of a portion of the first member 31 in Z-direction and the length of another portion of the first member 31 in Y-direction determined in the above manner, the distance between the second member 32 and the fins 20 is substantially less than or equal to ⅓ of the length of the fins 20 in Z-direction. This allows the first member 31 and the second member 32 to guide passing air to the ends of the fins 20.

The air guides 30 are preferably formed of a material with the coefficient of thermal expansion sufficiently close to the coefficient of thermal expansion of the fins 20 to an extent that it is preventable the damage to the fins 20 or the air guides 30 caused by deformation of the fins 20 receiving heat transferred from the electronic components 11 through the base 21 and deformation of the air guides 30 fitted to the fins 20 and receiving heat from the fins 20. For example, the air guides 30 are preferably formed of the same material as the fins 20.

As illustrated in FIG. 2, the first member 31 is adjacent to, across gaps 22, portions of fins 20 at the two ends in the direction in which the fins 20 are arranged, in other words, portions of the fins 20 at the two ends in Y-direction closer to the base 21 than to the ends of the fins 20 in the positive Z-direction. This allows heat from the fins 20 at the two ends in Y-direction to be transferred to passing air flowing through the gaps 22, improving the cooling performance of the electronic device 1.

As illustrated in FIGS. 4 to 6, the second member 32 is a plate extending in a direction surrounding the fins 20 extending in the X-axis and attached to the first member 31. The second member 32 may firmly be attached to the first member 31 to an extent that a positional relationship relative to the first member 31 does not change even under vibrations from the traveling vehicle 100. More specifically, the second member 32 is attached to the main surface 31*a* of the first member 31 with an attaching method such as fitting, brazing, welding, bonding with an adhesive, or fastening with a fastener.

The second member 32 has a main surface 32*a* extending away from the centers of the fins 20 in the first extension direction, in other words, the centers of the fins 20 in X-direction. The main surface 32*a* extends in a direction surrounding the fins 20 extending in the X-axis. In the embodiment, the main surface 32*a* extends in the first extension direction.

The second member 32 is attached to the base 21. The second member 32 may firmly be attached to the base 21 to an extent that a positional relationship relative to the base 21 does not change even under vibrations from the traveling vehicle 100. More specifically, the second member 32 is attached to the second main surface 21*b* of the base 21 with an attaching method such as fitting, brazing, welding, bonding with an adhesive, or fastening with a fastener.

With the second member 32 attached to the base 21, heat transferred from the electronic components 11 to the second member 32 through the base 21 is dissipated through heat radiation from the second member 32 and heat transfer from the second member 32 to ambient air around the second member 32. Further, heat transferred from the electronic components 11 to the first member 31 through the base 21 and the second member 32 is dissipated through heat radiation from the first member 31 and heat transfer from the first member 31 to ambient air around the first member 31. Dissipation in the above manner cools the electronic components 11.

Figure 7:
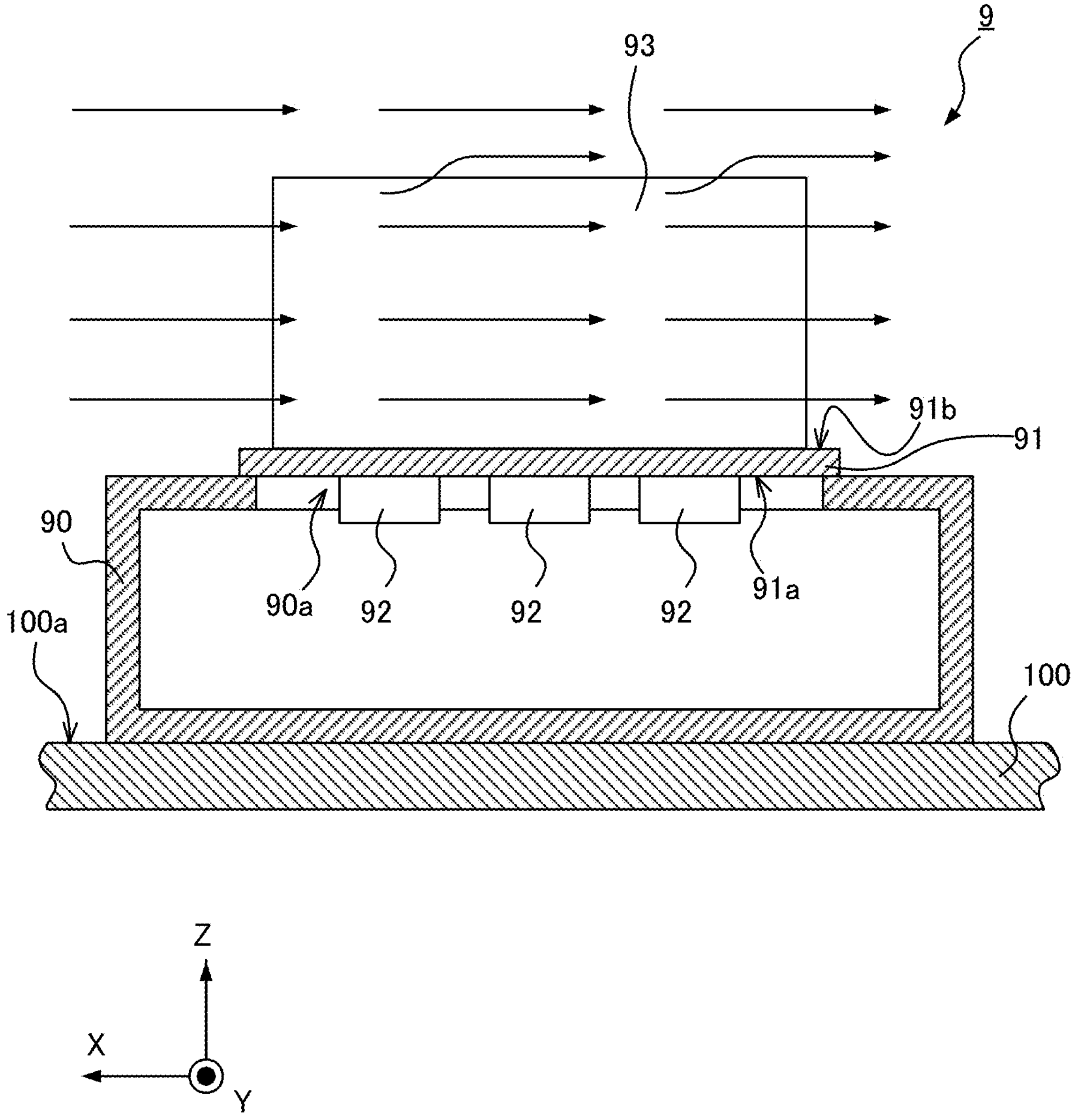
FIG. 7 is a diagram illustrating an airflow around an electronic device in a comparative example.

The flow of passing air around the electronic device 1 with the above structure is described below based on an example in which the electronic device 1 is installed on the vehicle 100 that travels in the positive X-direction. As a comparative example, FIG. 7 illustrates the flow of passing air around an electronic device 9 without the air guides 30. In FIG. 7, the solid arrows indicate the flow of passing air around the electronic device 9.

The electronic device 9 includes the same components as the electronic device 1 except the air guides 30. More specifically, the electronic device 9 includes a housing 90 attached to the roof 100*a* of the vehicle 100, a base 91 attached to the housing 90 to cover an opening 90*a* in the housing 90, electronic components 92 attached to a first main surface 91*a* of the base 91, and multiple fins 93 attached to a second main surface 91*b* of the base 91.

Passing air flowing from the front to the rear in the traveling direction of the vehicle 100, in other words, passing air flowing in the negative X-direction, flows along the fins 93. While flowing between the fins 93, a part of the passing air deflects in the positive Z-direction and flows along the ends of the fins 93 in the positive Z-direction.

Figure 8:
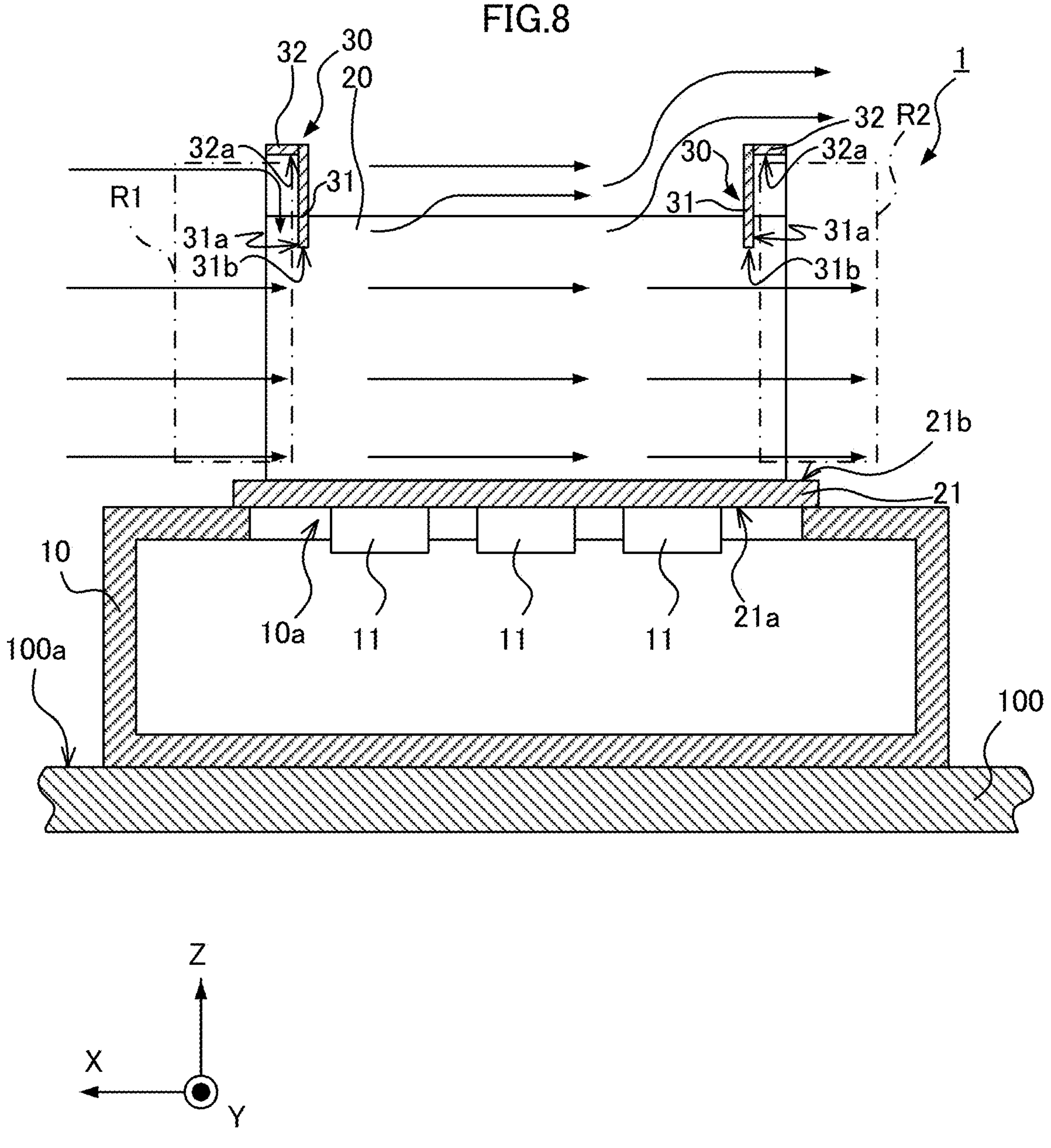
FIG. 8 is a diagram illustrating an airflow around the electronic device according to the embodiment.

FIG. 8 illustrates the flow of passing air around the electronic device 1. In FIG. 8, the solid arrows indicate the flow of passing air around the electronic device 1. The electronic device 1 includes the air guide 30 surrounding the ends of the fins 20 in the positive X-direction. A part of passing air flowing in the negative X-direction is thus guided by the air guides 30 to flow in the negative Z-direction and reach the ends of the fins 20 in the positive X-direction. In other words, more passing air than in FIG. 7 reaches the ends of the fins 20 in the positive X-direction. This causes the air pressure in a region R1 indicated by the dot-dash line in FIG. 8, or more specifically, a region R1 including the ends of the fins 20 in the positive X-direction, to be higher than the air pressure in FIG. 7 and be positive pressure higher than the atmospheric pressure.

A part of passing air flowing between the fins 20 deflects in the positive Z-direction and flows along the ends of the fins 20 in the positive Z-direction. With the ends of the fins 20 in the negative X-direction surrounded by the air guide 30 in the electronic device 1, the passing air flowing along the ends of the fins 20 in the positive Z-direction deflects further in the positive Z-direction, and flows in the negative X-direction as being guided by the air guides 30. This causes, as indicated by the dot-dash line in FIG. 8, the air pressure in a region R2 including the ends of the fins 20 in the negative X-direction to be lower than the air pressure in FIG. 7 and be negative pressure lower than the atmospheric pressure. Thus, in the electronic device 1, the ends of the fins 20 in the positive X-direction and the ends of the fins 20 in the negative X-direction have a pressure difference larger than in the example in FIG. 7. This increases the speed of passing air flowing in the negative X-direction between the fins 20, improving the cooling performance of the electronic device 1.

When the vehicle 100 travels in the negative X-direction, the air pressure in the region R2 is positive pressure, and the air pressure in the region R1 is negative pressure. Thus, passing air flowing in the positive X-direction between the fins 20 flows faster than in the electronic device 9 without the air guides 30 as in FIG. 7, improving the cooling performance of the electronic device 1.

When the air guides 30 are larger, or more specifically, when the main surface 31*a* of each first member 31 has a larger area, the air pressure in the region R1 increases, and the air pressure in the region R2 decreases, improving the cooling performance of the electronic device 1. To improve the cooling performance of the electronic device 1, it is preferable to increase the size of the air guides 30 within a vehicle limit defined by the maximum dimensions of the vehicle 100. For the air guides 30 to be larger within the vehicle limit, the fins 20 are to be smaller. However, smaller fins 20 reduce the cooling performance. The size of the air guides 30 are preferably determined as appropriate for the intended cooling performance of the electronic device 1 and the range of the vehicle limit.

In the electronic device 1 according to the embodiment as described above, the air guides 30 increase the pressure difference between the ends of the fins 20 in the positive X-direction and the ends of the fins 20 in the negative X-direction. This causes passing air flowing between the fins 20 to flow faster, improving the cooling performance of the electronic device 1.

The air guides 30 attached to the base 21 can be used as handles when the base 21 is attached to an upper portion of the housing 10 in the vertical direction during assembly of the electronic device 1. The air guides 30 attached to the base 21 as handles cause no stress on the fins 20, reducing deformation of the fins 20 during assembly of the electronic device 1.

Figure 9:
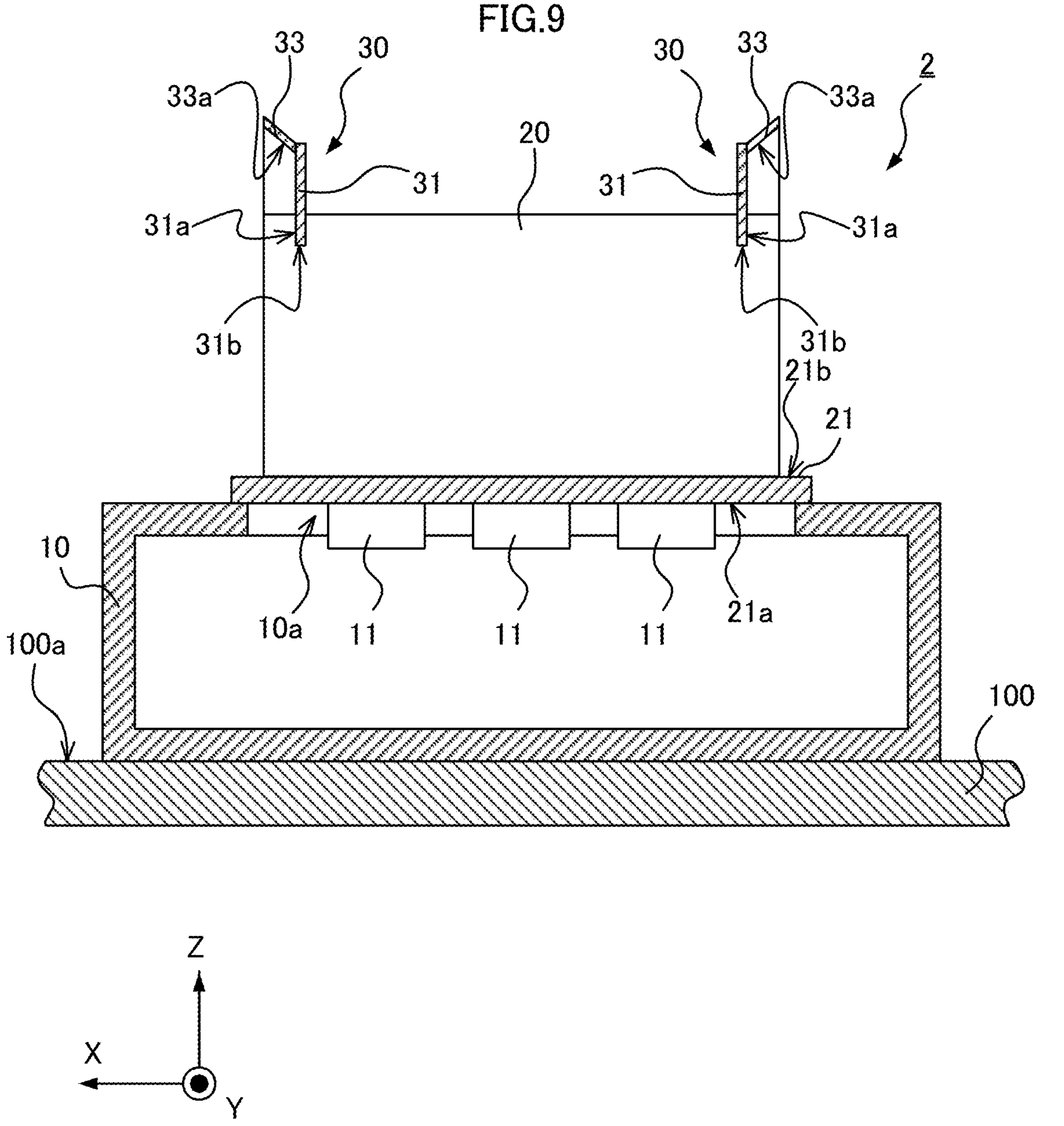
FIG. 9 is a cross-sectional view of an electronic device according to a first modification of the embodiment.

The present disclosure is not limited to the above embodiment. The air guides 30 may have any shape that can increase the pressure difference between the ends of the fins 20 in the positive X-direction and the ends of the fins 20 in the negative X-direction. FIG. 9 illustrates an example electronic device 2 including air guides 30 with a shape different from the shape of the air guides in the embodiment. Each air guide 30 in the electronic device 2 includes a first member 31 and a second member 33 attached to the first member 31.

The second member 33 has a main surface 33*a* extending away from the centers of the fins 20 in X-direction and surrounding the fins 20. A space defined by the second member 33 and the base 21 has, perpendicularly to the first extension direction, a cross-sectional area that decreases toward the centers of the fins 20 in the first extension direction. In other words, of the two ends of the second member 33 in the first extension direction, one end closer to the centers of the fins 20 in the first extension direction has a shorter perimeter about X-axis than the other end. The air guides 30 with the above shape allow passing air to reach the ends of the fins 20 more smoothly.

Figure 10:
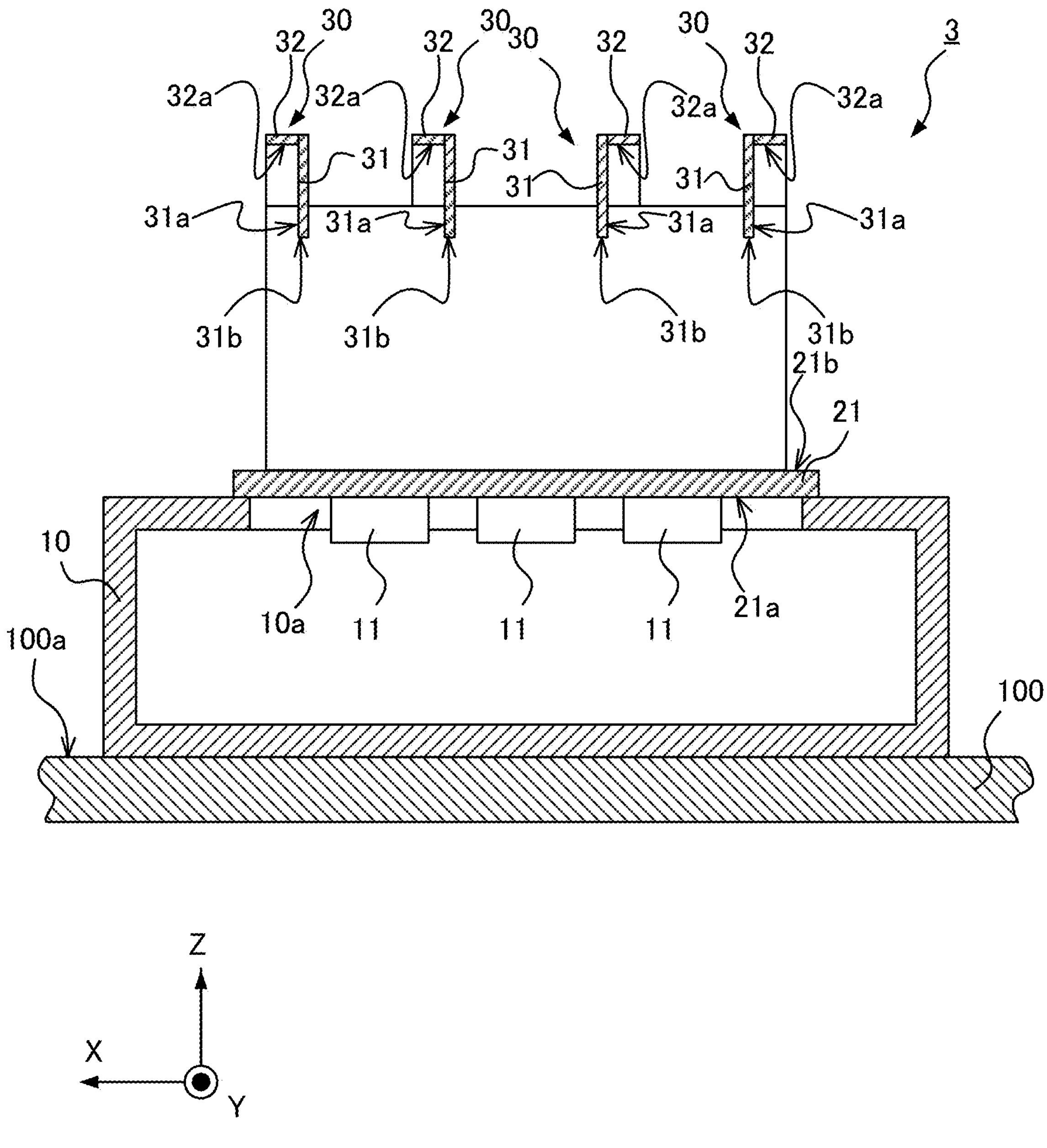
FIG. 10 is a cross-sectional view of an electronic device according to a second modification of the embodiment.

The electronic devices 1 and 2 may each include any number of air guides 30. For example, the electronic devices 1 and 2 may each simply include an air guide 30 at the end in the positive X-direction or the negative X-direction. As another example, FIG. 10 illustrates an electronic device 3 including four air guides 30. The four air guides 30 in the electronic device 3 have the same structure and are symmetric with respect to the YZ plane including the centers of the fins 20 in X-direction.

Figure 11:
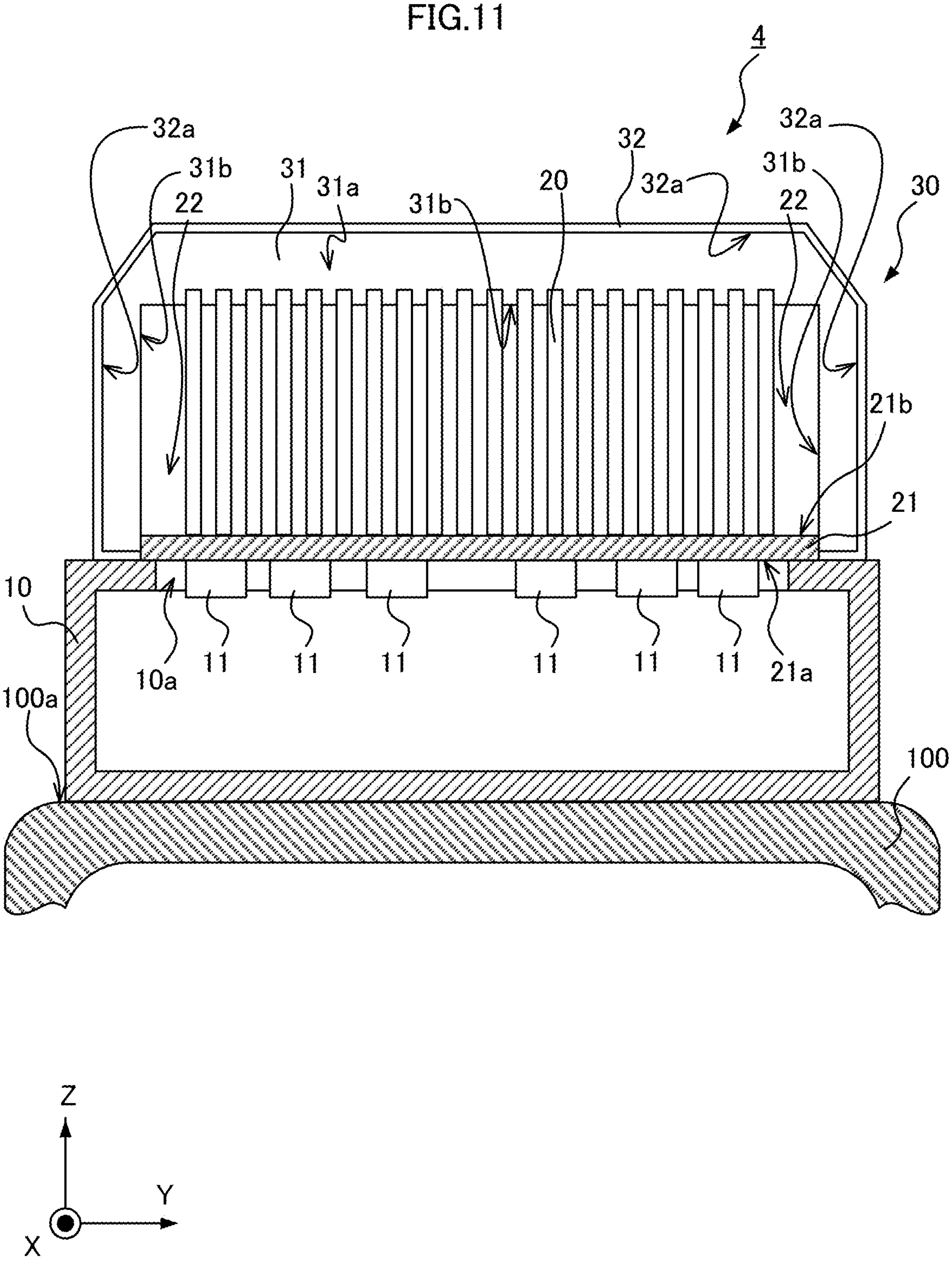
FIG. 11 is a cross-sectional view of an electronic device according to a third modification of the embodiment.

In the embodiment, the air guides 30 are attached to the base 21. The air guides 30 may be fixed in any manner other than the manner described above. As an example, FIG. 11 illustrates an electronic device 4 including air guides 30 attached to the housing 10. Second members 32 in the air guides 30 included in the electronic device 4 may firmly be attached to the housing 10 to an extent that a positional relationship relative to the housing 10 does not change even under vibrations from the traveling vehicle 100. More specifically, the second members 32 are attached to the outer surface of the housing 10 with an attaching method such as fitting, brazing, welding, bonding with an adhesive, or fastening with a fastener.

Figure 12:
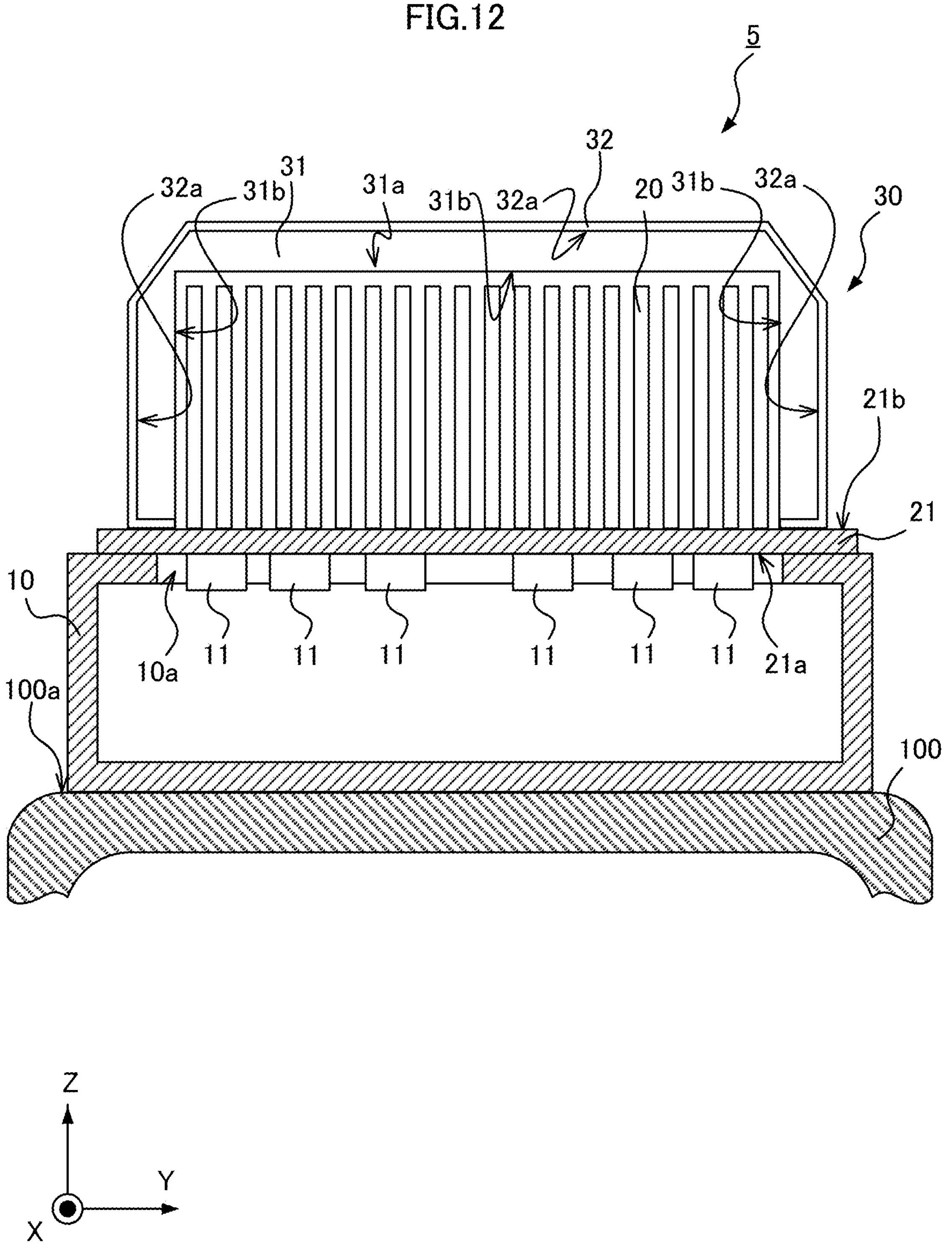
FIG. 12 is a cross-sectional view of an electronic device according to a fourth modification of the embodiment.

In the embodiment, the first members 31 in the air guides 30 are in contact with the fins 20. The first members 31 may be separate from the fins 20 as illustrated in FIG. 12. First members 31 in air guides 30 included in an electronic device 5 illustrated in FIG. 12 are separate from but adjacent to the fins 20, and surround the fins 20. It is preferable that the first members 31 are provided sufficiently close to the fins 20 to an extent that the air pressure at the ends of the fins 20 in X-direction can be allowed to be positive pressure or negative pressure.

The first members 31 and the second members 32 and 33 may have any shapes other than the shapes in the above examples. For example, a portion of each first member 31 may be shaped to come in contact with the base 21 or the housing 10. In this case, the first members 31 may be attached to the base 21 or the housing 10. Each first member 31 and the corresponding second member 32 or 33 may be integral with each other.

Figure 13:
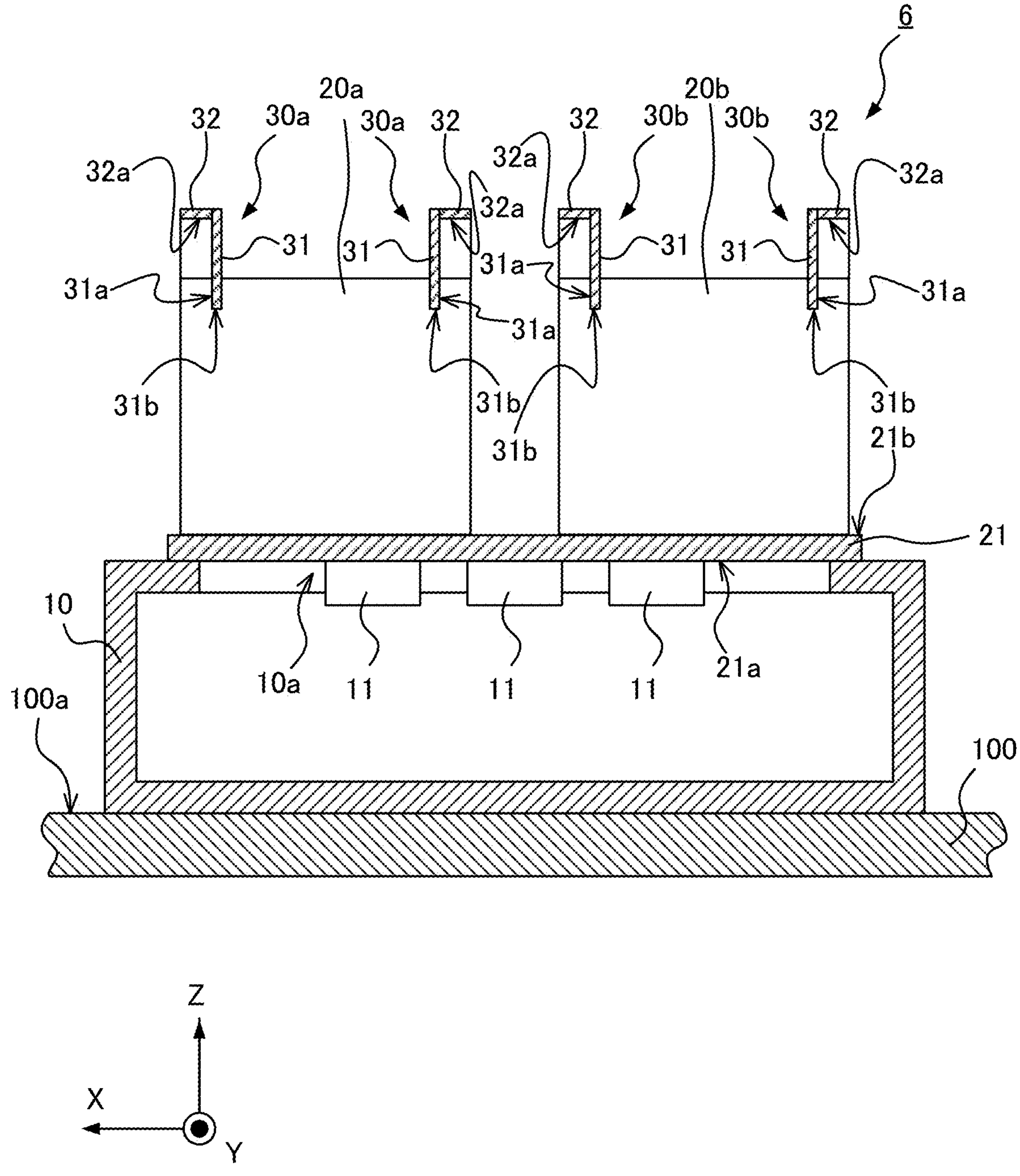
FIG. 13 is a cross-sectional view of an electronic device according to a fifth modification of the embodiment.

The electronic devices 1 to 5 may each include any number of fins 20 that have any shape and are arranged in any manner to cool the electronic components 11 through heat transfer to air flowing between the fins 20. For example, FIG. 13 illustrates an electronic device 6 including fins arranged in X-direction and Y-direction. The electronic device 6 includes twenty fins 20*a* arranged in Y-direction and twenty fins 20*b* located in the negative X-direction from the fins 20*a* and arranged in Y-direction.

The electronic device 6 includes two air guides 30*a* located at both ends of the fins 20*a* in X-direction and two air guides 30*b* located at both ends of the fins 20*b* in X-direction. The air guides 30*a* and 30*b* have the same structure as the air guides 30. The two air guides 30*a* are symmetric with respect to the YZ plane including the centers of the fins 20*a* in X-direction. The two air guides 30*b* are symmetric with respect to the YZ plane including the centers of the fins 20*b* in X-direction.

The fins 20, 20*a*, and 20*b* may each have any shape other than the shapes in the above examples. For example, the fins 20, 20*a*, and 20*b* may each be a plate with a nonuniform thickness or a member with a curved surface.

The electronic components 11 may not be switching elements, and may be, for example, any electronic components that are accommodated in the housing 10 and generate heat, such as thyristors or diodes.

The electronic devices 1 to 6 may each cool the electronic components 11 in any manner other than using passing air. For example, the electronic devices 1 to 6 may each cool the electronic components 11 through heat transfer to cooling air provided from a fan and flowing between the fins 20, 20*a*, or 20*b*.

The electronic devices 1 to 6 may each be installed on a place other than the roof 100*a* of the vehicle 100. For example, the electronic devices 1 to 6 may each be installed on the floor of the vehicle 100. The electronic devices 1 to 6 are each attachable to any vehicle other than the railway vehicle that causes passing air, such as a trolley bus or a streetcar.

The electronic devices 1 to 6 may each be any electronic device installed indoors or outdoors, other than an in-vehicle device installed on a railway vehicle. In this case, the electronic devices 1 to 6 may each cool the electronic components 11 through heat transfer to cooling air provided from a fan and flowing between the fins 20, 20*a*, or 20*b*.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

1, 2, 3, 4, 5, 6, 9 Electronic device
10, 90 Housing
10*a*, 90*a* Opening
11, 92 Electronic component
20, 20*a*, 20*b*, 93 Fin
21, 91 Base
21*a*, 91*a* First main surface
21*b*, 91*b* Second Main Surface
22 Gap
30, 30*a*, 30*b* Air guide
31 First member
31*a*, 32*a*, 33*a* Main surface
31*b* Side surface
31*c* Slit
32, 33 Second member
100 Vehicle
100*a* Roof
R1, R2 Region

The invention claimed is:

1. An electronic device, comprising:
a base being heat conductive and having a first main surface to which an electronic component is attachable;
a plurality of fins spaced from one another and attached to a second main surface of the base, the second main surface being opposite to the first main surface, the plurality of fins extending in a first extension direction along the second main surface and in a second extension direction away from the second main surface, the plurality of fins being configured to dissipate heat transferred from the electronic component through the base to ambient air; and
one or more air guides each including a first member surrounding the plurality of fins, having a main surface intersecting with the first extension direction, and having a plurality of slits fitted with ends of the plurality of fins distant from the base, and a second member attached to the first member and having a main surface extending away from centers of the plurality of fins in the first extension direction, wherein
two fins of the plurality of fins are located at two ends in a direction in which the plurality of fins are arranged,
each of the two fins has portions that are located at two opposite ends of the fin, one end of the two ends being closer to the base than the other end of the two ends, and
the first member is, in the direction in which the plurality of the fins are arranged, separated from the portions of the two fins that are closer to the base by an air gap.

2. The electronic device according to claim 1, wherein
the one or more air guides is a plurality of the air guides, and
the plurality of air guides include an air guide adjacent to one end of each of the plurality of fins in the first extension direction and another air guide adjacent to another end of each of the plurality of fins in the first extension direction.

3. The electronic device according to claim 2, wherein
the second member has the main surface extending in the first extension direction.

4. The electronic device according to claim 2, wherein
a space defined by the second member and the base has, perpendicularly to the first extension direction, a cross-sectional area decreasing toward the centers of the plurality of fins in the first extension direction.

5. The electronic device according to claim 2, wherein
the plurality of fins are arranged in a direction perpendicular to the first extension direction and the second extension direction, and in the first extension direction.

6. The electronic device according to claim 2, wherein
the one or more air guides are attached to the base.

7. The electronic device according to claim 2, further comprising:
a housing accommodating the electronic component and having an opening, wherein
the base is attached to the housing with the first main surface covering the opening in the housing, and
the one or more air guides are attached to the housing.

8. The electronic device according to claim 2, wherein
the electronic device is installable on a vehicle with the first extension direction aligned with a traveling direction of the vehicle.

9. The electronic device according to claim 1, wherein
the plurality of fins are arranged in a direction perpendicular to the first extension direction and the second extension direction, and in the first extension direction.

10. The electronic device according to claim 9, wherein
the one or more air guides are attached to the base.

11. The electronic device according to claim 9, further comprising:
a housing accommodating the electronic component and having an opening, wherein
the base is attached to the housing with the first main surface covering the opening in the housing, and
the one or more air guides are attached to the housing.

12. The electronic device according to claim 9, wherein
the electronic device is installable on a vehicle with the first extension direction aligned with a traveling direction of the vehicle.

13. The electronic device according to claim 1, wherein
the one or more air guides are attached to the base.

14. The electronic device according to claim 1, further comprising:
a housing accommodating the electronic component and having an opening, wherein
the base is attached to the housing with the first main surface covering the opening in the housing, and
the one or more air guides are attached to the housing.

15. The electronic device according to claim 1, wherein
the electronic device is installable on a vehicle with the first extension direction aligned with a traveling direction of the vehicle.

* * * * *